United States Patent
Chao et al.

(10) Patent No.: US 8,367,965 B2
(45) Date of Patent: Feb. 5, 2013

(54) ELECTRODE DESIGN FOR PLASMA PROCESSING CHAMBER

(75) Inventors: Benson Chao, Hsinchu (TW); Chi-Hua Tseng, Jubei (TW)

(73) Assignee: Hermes-Epitek Corp., Hsinchu (TW)

( * ) Notice: Subject to any disclaimer, the term of this patent is extended or adjusted under 35 U.S.C. 154(b) by 1196 days.

(21) Appl. No.: 12/199,932

(22) Filed: Aug. 28, 2008

(65) Prior Publication Data

US 2010/0051592 A1 Mar. 4, 2010

(51) Int. Cl.
*B23K 10/00* (2006.01)
(52) U.S. Cl. ......... 219/121.52; 219/121.43; 219/121.48; 118/723 MW; 156/345.33
(58) Field of Classification Search ............... 219/121.4, 219/121.41, 121.43, 121.52, 121.51; 315/111.21; 118/723 R, 723 MW; 156/345.33, 345.44; 204/298.07
See application file for complete search history.

(56) References Cited

U.S. PATENT DOCUMENTS

| 6,777,880 | B2 * | 8/2004 | Morfill et al. | 315/111.21 |
| 6,779,483 | B2 * | 8/2004 | Yuda et al. | 118/723 E |
| 6,863,020 | B2 * | 3/2005 | Mitrovic et al. | 118/723 E |
| 7,220,937 | B2 * | 5/2007 | Hofman et al. | 219/121.55 |
| 7,506,610 | B2 * | 3/2009 | Koshiishi et al. | 118/723 E |
| 7,686,971 | B2 * | 3/2010 | Saitoh et al. | 216/67 |

* cited by examiner

*Primary Examiner* — Mark Paschall
(74) *Attorney, Agent, or Firm* — Muncy, Geissler, Olds & Lowe, PLLC (57) ABSTRACT

An upper electrode for use in a plasma processing chamber is provided, which includes a center segment and a plurality of outer segments. The outer segments are attached to the center segment to adjust the area of the overall electrode. Gas distribution holes may be selectively formed on the center and outer segments, or both. By adding or removing the outer segments and stacking layers, the dimension of the electrode, the area of gas spurting region and the thickness of the provided upper electrode may be adjusted.

27 Claims, 10 Drawing Sheets

| | Laminate 1 | | |
| --- | --- | --- | --- |
| | Laminate 2 | | |
| | Laminate 3 | | |

Fig.4 though the present invention is illustrated by
ELECTRODE DESIGN FOR PLASMA PROCESSING CHAMBER

FIELD OF THE INVENTION

The present invention generally relates to an electrode for use in a plasma processing chamber, and more particularly to an upper electrode that can be easily fabricated, and has a longer service life.

DESCRIPTION OF THE RELATED ART

Silicon wafer is a substrate material used in the fabrication of integrated circuit and other microdevices. Many of the integrated circuit fabrication process involve plasma, such as dry etch, chemical vapor deposition, physical vapor deposition, and etc. The standard wafer size has increased over the years from 100 mm to 150 mm, 200 mm, up to 300 mm as a standard diameter used in today's facilities. At present, manufacturers are planning for 450 mm and larger diameter silicon wafer. For properly performing a plasma related fabrication process, such as dry etch process, the upper electrode of the plasma process chamber has also been correspondingly improved in size to provide a larger gas spurting area. The major challenge in fabricating a large upper electrode lies in the fabrication of a large electrical (e.g. cathode) plate, a key component of the upper electrode, which requires large silicon ingots of semiconductor grade. Although any dimension of semiconductor grade monocrystalline silicon ingot can be fabricated using the Czochralski method, fabrication efficiency and cost of silicon ingot are still great barricades to overcome in fabricating large electrical plates.

As mentioned earlier, the standard wafer size for semiconductor fabrication increased from 100 mm to 300 mm, the silicon electrical plate within an upper electrode of a plasma processing chamber must also be correspondingly increased. Under the current trend toward a 450 mm diameter silicon wafers, the technical bottleneck for efficient fabrication of suitable upper electrode for the plasma process is expected. Therefore, it is highly desirable to provide improved configuration/fabrication process of a plasma upper electrode to overcome this issue.

SUMMARY OF THE INVENTION

The present invention is directed to a structure of an upper electrode for use in a plasma process reaction chamber. The disclosed upper electrode allows adjustment of the electrode size and thickness according to the requirements. It should be noted that even though the present invention is illustrated by an embodiment of fabricating a structure of an upper electrode for a plasma processing chamber, however it would be recognized by those skilled in the art that the present invention has a much broader range of applicability.

One embodiment of the present invention is to provide a structure of an upper electrode for use in a plasma processing chamber. The electrode comprises a center segment and a plurality of extension segments. The extension segments may be attached to the center segment to adjust the spurting area covered by the electrode. Gas distribution holes may be selectively formed on the center segment and or extension segments. By adding or removing the extension segments, the dimension of the upper electrode and the area of gas spurting region of the upper electrode may be adjusted.

During the fabrication process, the electrode may be configured to dispense very large silicon ingots, therefore large size upper electrodes may be fabricated relatively more easily compared to the conventional process. One embodiment of the present invention suggests that by patching plurality of smaller dimension silicon slabs to configure the electrode with desired dimension and gas spurting area.

Another embodiment of the present invention use plasma etch system as an example to illustrate an example plasma process system with flexibility of handling and varying sample size. The plasma etch system comprises a process reaction chamber, a vacuum device, a chuck electrode, an upper electrode, a power source and a gas supply device. The upper electrode comprises an electrical plate including a center plate and a plurality of extension segment plates. The extension segment plates comprise a plurality of gas distribution holes. Therefore, by adding or removing extension segment plates, the dimension of the upper electrode and the gas spurting area of the upper electrode may be correspondingly increased or decreased.

According to yet another embodiment of the present invention, the upper electrode may be comprised of a plurality of laminated segments stacked on each other, and the thickness of the upper electrode may be adjusted by adjusting the number of laminated segments.

According to yet another embodiment of the present invention, the surface of the center plate and at least one of the extension segment plates may be coated with a protective coating layer comprised of plasma erosion preventing material, such as silicon nitride ($Si_3N_4$) or silicon carbide (SiC). The protection coating may extend through the gas distributing hole. The center plate and/or extension segment plates may further comprise at least one coating free region for facilitating electrical connection of the center plate and extension segment plates to the plasma process reaction chamber.

BRIEF DESCRIPTION OF THE DRAWINGS

FIGS. 2A, 2A-1, 2B, 2B-1, 2C, 2D, 2E, 2F and 2F-1 are diagrammatic representations of varying patched upper electrode according to one embodiment of the present invention;

FIGS. 3A, 3A-1, 3B and 3B-1 are diagrammatic representations of an upper electrode coated with silicon nitride protecting coating according to another embodiment of the present invention.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
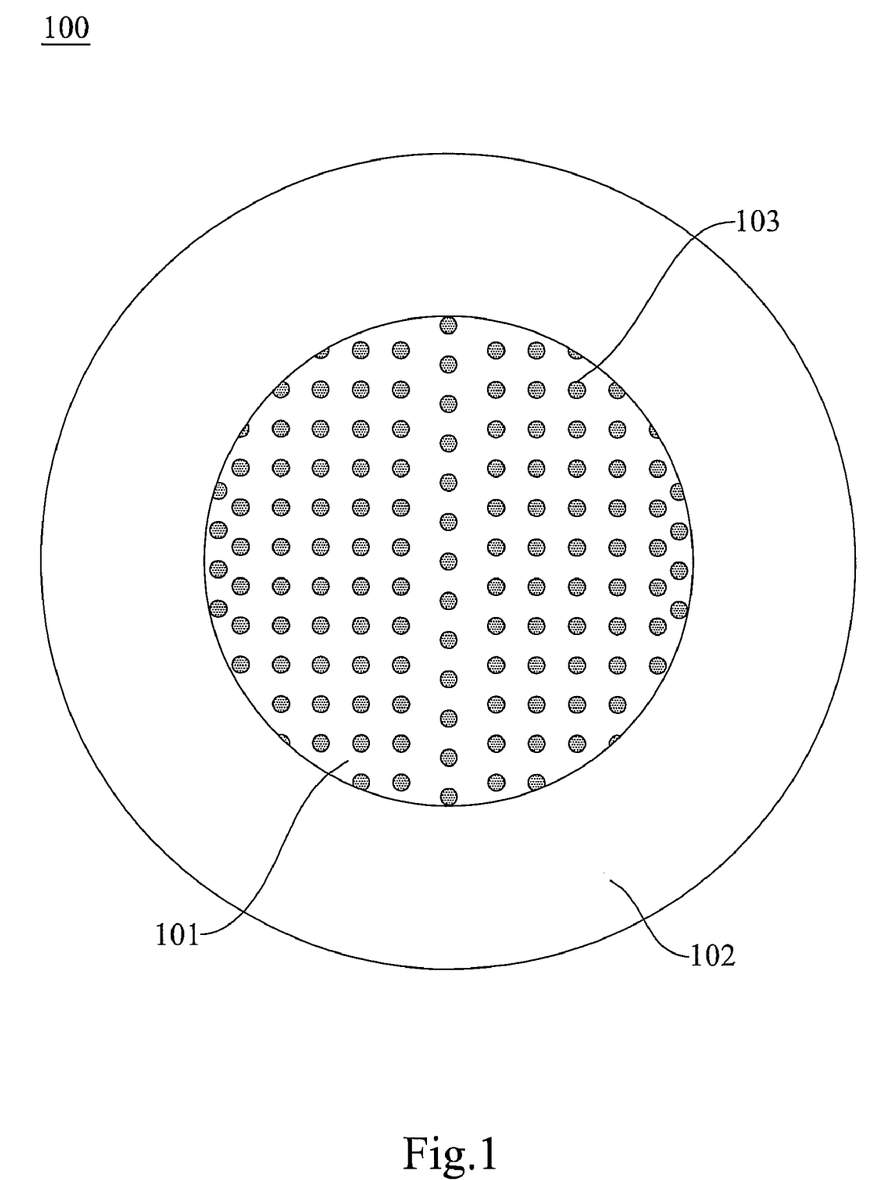
FIG. 1 is a diagrammatic representation of a conventional upper electrode.

FIG. 1 is a diagrammatic representation of a conventional upper electrode 100 of a dry etch process chamber. The conventional upper electrode 100 comprises an electrical plate (101, 102). The electrical plate (101, 102) is made of semiconductor grade silicon. Some electrical plate design for other plasma process may also be comprised of an aluminum alloy cooling plate bonded to the electrical plate (101, 102). The electrical plate (101, 102) is usually in the form of a disk of 4 mm thick. A large number of gas distribution holes 103 are formed in the region 101. These gas distribution holes may have a diameter of, say, 0.6 mm, and is arranged to form a lattice at a pitch of, for example, 7 mm. The electrical plate (101, 102) for a 12-inch wafer has a diameter of 380 mm. In this case, it is desirable to set the diameter of the gas spurting region, in which the gas distribution holes 103 are formed, at 280 mm or more. However, producing such a silicon ingot to fulfill the engineering requirements of the electrical plate is time consuming and very expensive.

Figure 2A:
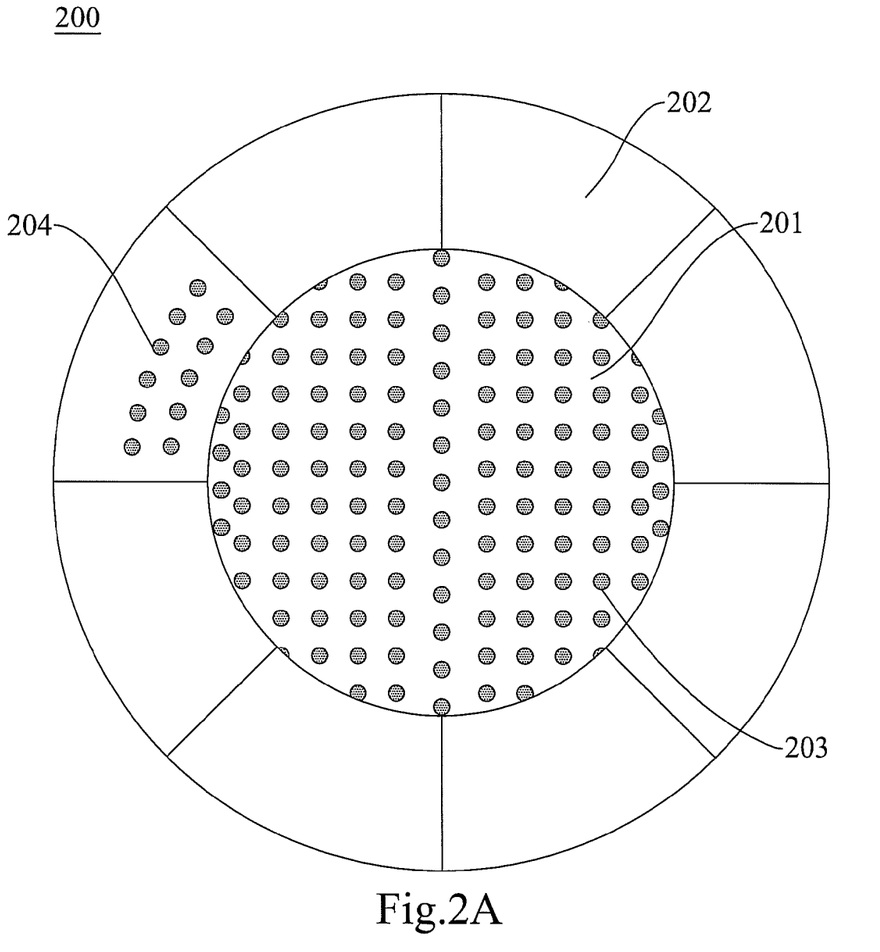
Figure 2A:
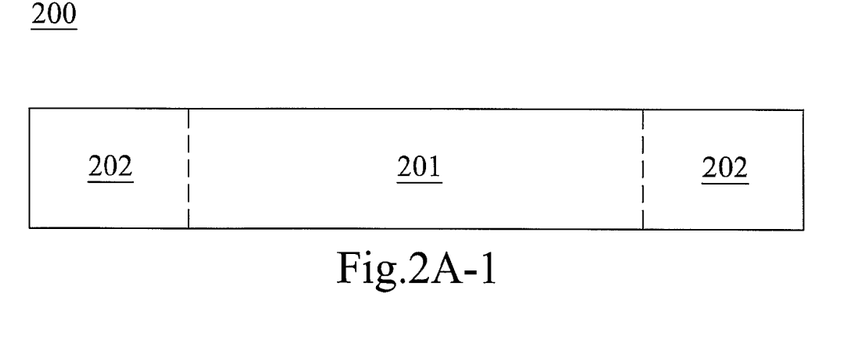
Figure 2B:
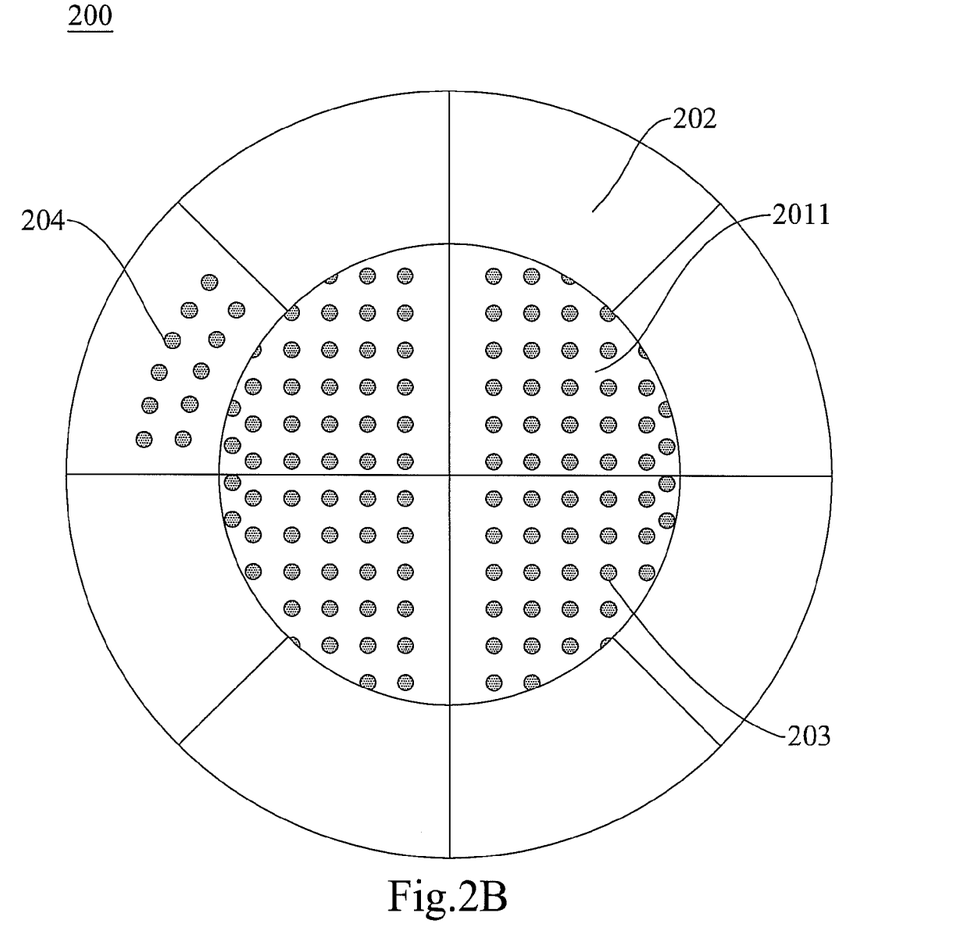
Figure 2B:
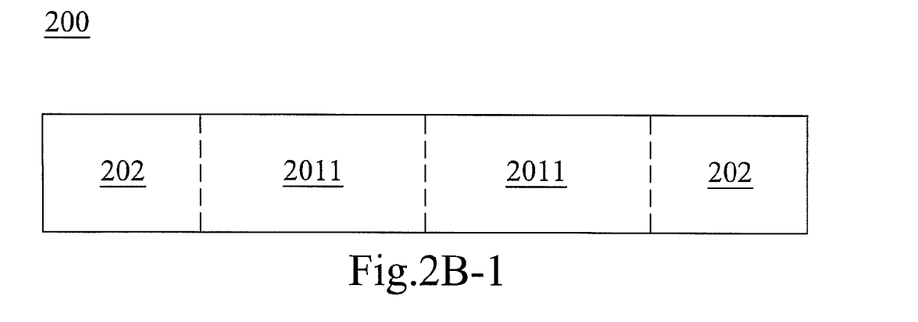
Figure 2C:
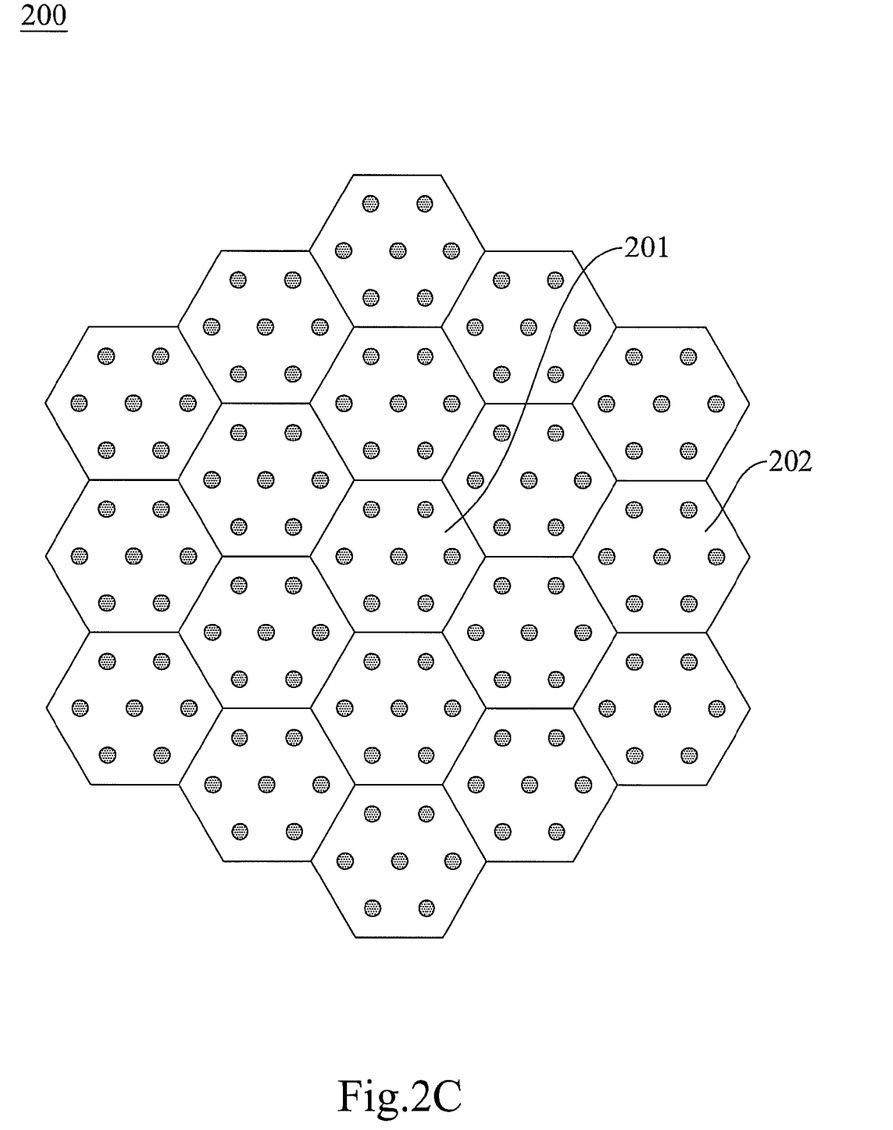
Figure 2D:
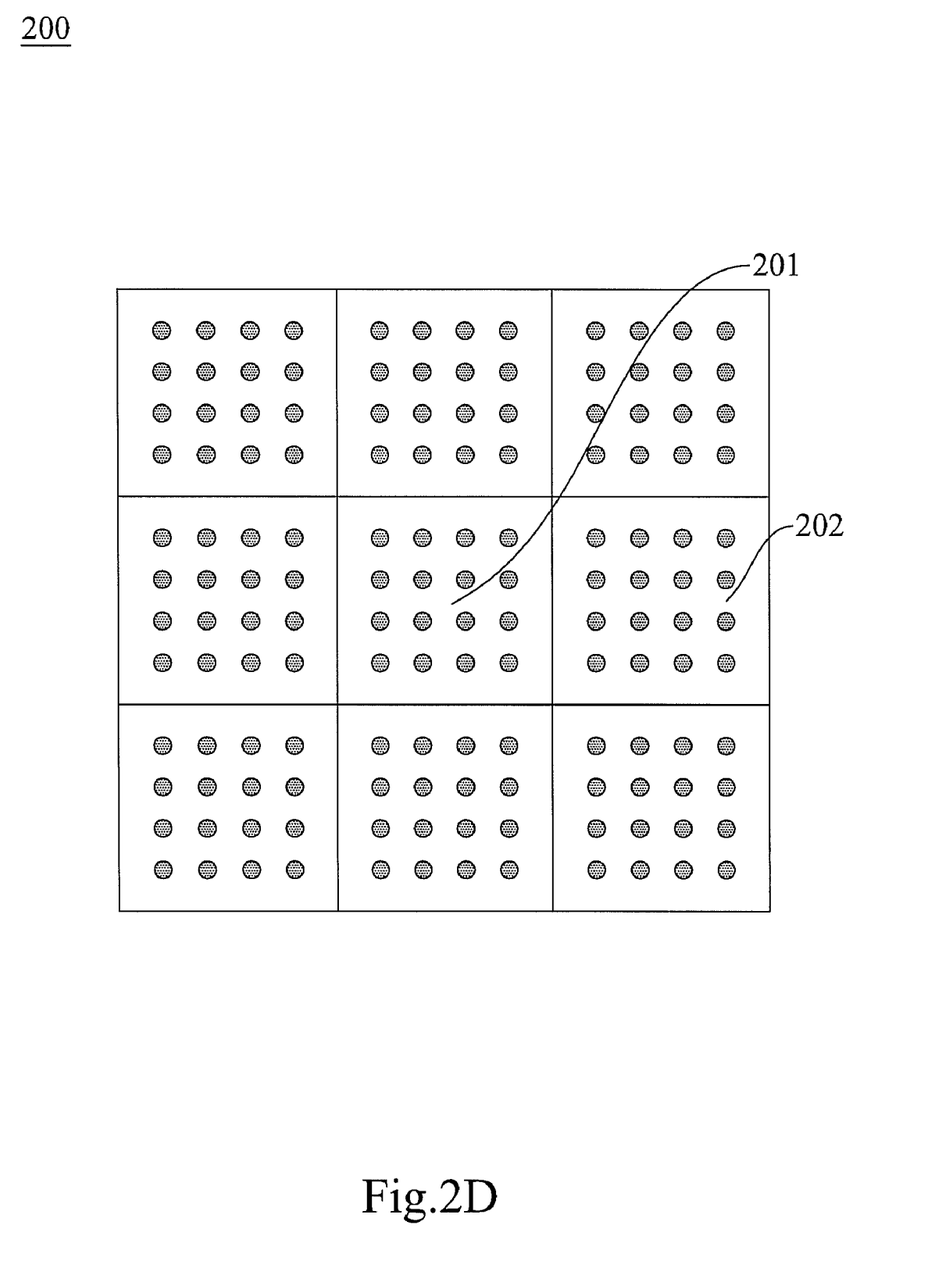
Figure 2E:
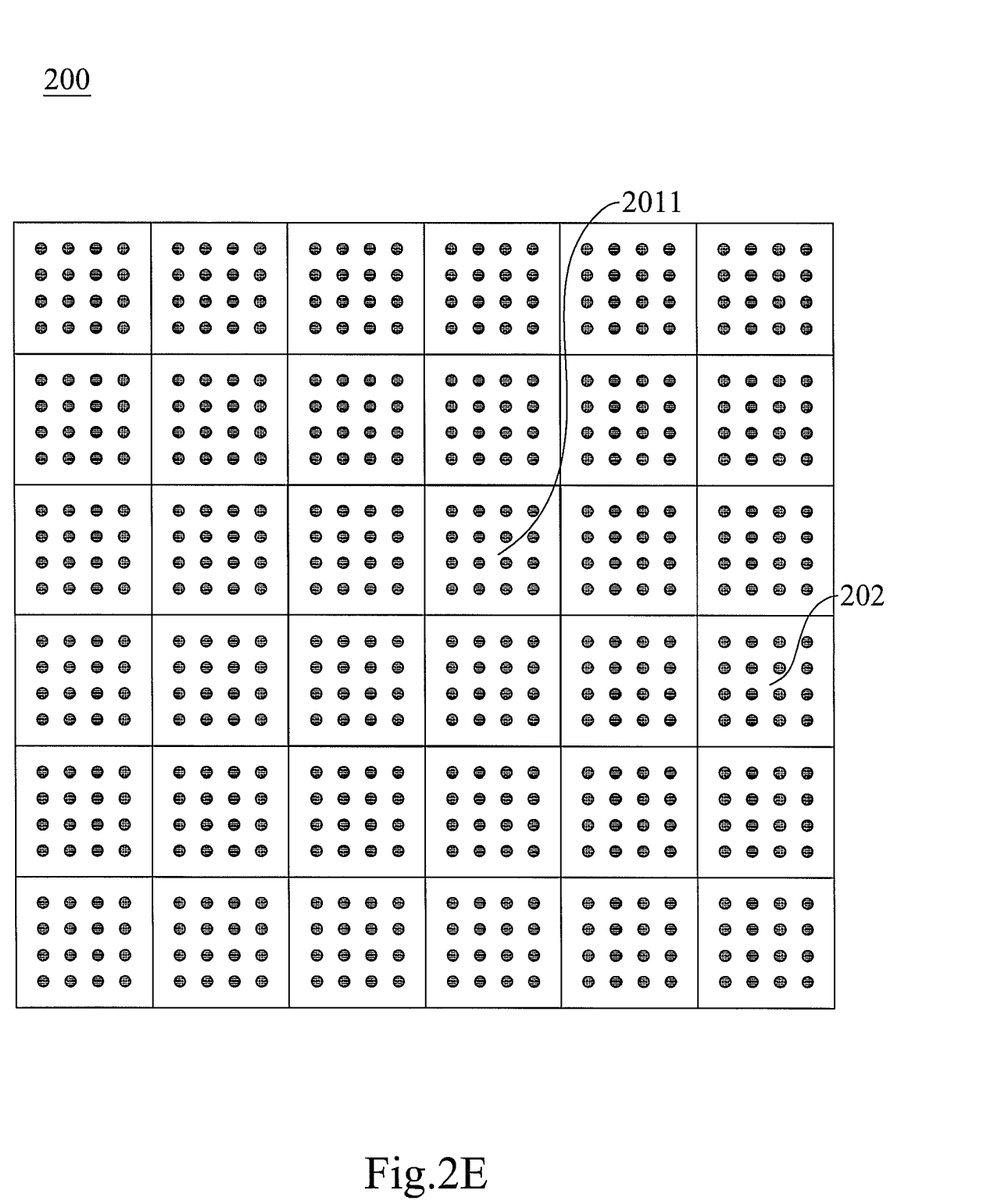

To resolve this problem, in one embodiment of the present invention, a structure of an upper electrode 200 is provided, as illustrated in FIGS. 2A, 2A-1, 2B, 2B-1, 2C, 2D, 2E, 2F and 2F-1. Referring to FIG. 2A, the electrode 200 comprises a center plate 201 and a plurality of extension segment plates 202 disposed around the center plate 201, and a processing gas inlet (not shown). The center plate 201 may comprise a circular or polygonal shape with a plurality of holes on it to facilitate gas distribution. The extension segment plates 202 may be attached together and may be configured in different dimension and shapes. For example, the center plate 201 comprises a circular shape as illustrated in FIGS. 2A, 2A-1, 2B, 2B-1, 2F and 2F-1, a hexagonal shape as illustrated in FIG. 2C, and a rectangular shape as illustrated in FIGS. 2D and 2E. In one example, the center plate 201 comprises of at least one center segment plate 2011, as illustrated in FIGS. 2B and 2E. The thickness of the electrode or the center plate 201 and or the extension segment plates 202 can be adjusted by adjusting the number of the stacked laminated segments. As illustrated in FIGS. 2A and 2B, a plurality of first gas distribution holes 203 are formed on the center plate 201 to communicate with the processing gas inlet (not shown) and to guide the processing gas into the plasma process reaction chamber. In one example, the first gas distribution holes 203 faces a chuck electrode disposed within the plasma process reaction chamber, wherein the chuck electrode is located spatially corresponding to the upper electrode. For instance, the chuck electrode is located opposite to the upper electrode.

As illustrated in FIGS. 2A and 2B, in one example of the present invention, a plurality of second gas distribution holes 204 is formed on at least one of the extension segment plates 202. The second gas distribution holes 204 communicate with the above-mentioned gas inlet and guide the processing gas into the plasma process reaction chamber. The second gas distribution holes 204 also preferably face the above-mentioned chuck electrode.

In one example, the first and second gas distribution holes 203, 204 are identical. In another example, they are different in at least one structural characteristic. For example, the first and second gas distribution holes 203, 204 can be different in diameter, opening shape, interior configuration, etc.

The area of gas spurting region is composed of areas of gas distribution holes 203 and 204. As illustrated in FIGS. 2A, 2A-1, 2B, 2B-1, 2C, 2D, 2E, 2F and 2F-1, in the present embodiment, the center gas spurting region formed on the center plate 201 has a fixed area, while that on the extension segment plates 202, because the extension segment plates 202 can be removed or added on demand, has a varying contribution to the overall gas spurting region. In other words, the area of gas spurting region can be adjusted by adding/removing the extension segment plates 202 during or prior to fabrication process. In one example, the gas spurting area can be increased by adding the extension segment plates 202 and decreased by removing the extension segment plates 202. On the other hand the dimension of the upper electrode can be altered by adding or removing the extension segment plates.

Figure 2F:
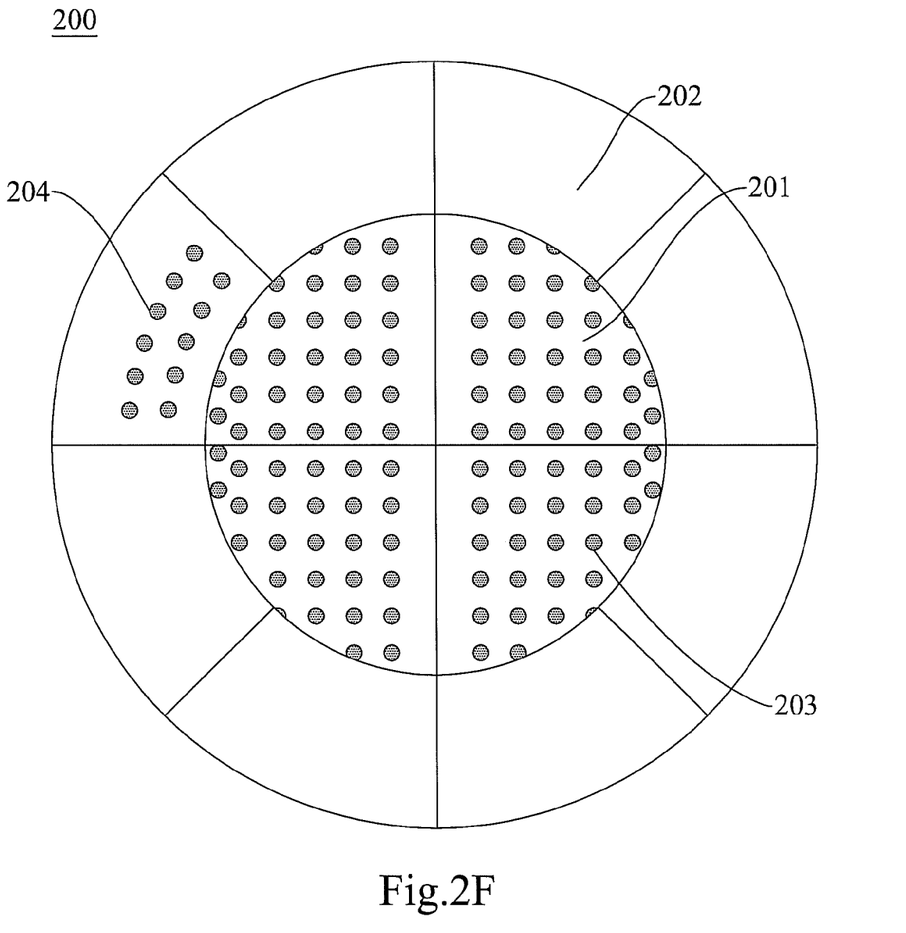
Figure 2F:
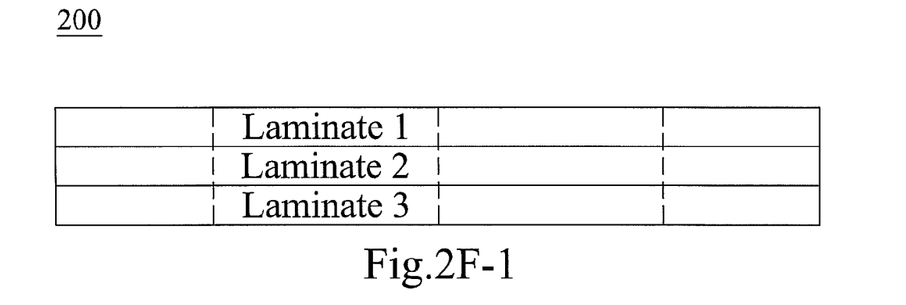

In one embodiment, the center plate 201 is surrounded by and attached to the extension segment plates 202. The extension segment plates 202 can be attached to each other and to the center plate 201 as well. The center segment plates 2011 and the extension segment plates 202 may have an arbitrary shape including a polygon or curved edge. For example, they may be circular and sectorial as illustrated in FIGS. 2A, 2B and 2F. Alternatively, they may be in rectangular or hexagonal shape, as illustrated in FIGS. 2C, 2D and 2E. Further, as illustrated in FIGS. 2C, 2D and 2E, in some examples of the present invention, the center segment plate 2011 may be identical to the extension segment plate 202. On the other hand, as illustrated in FIG. 2F-1, which is a cross sectional view of the upper electrode 200, the upper electrode 200 may be comprised of a plurality of segments arranged layer by layer to form a stack-structure.

The extension segment plates 202 can be bonded to each other and to the center plate by brazing, soldering, adhering or mechanical fitting method, or any combination thereof. In one embodiment, the adhesives or bonding materials, or materials used to build the mechanical fitting structure could be thermally and electrically conductive materials, such as metals, conductive epoxies, or the like. The bonding material may be preferably formed from low vapor pressure materials which have lower tendencies to contaminate low pressure reactor environments.

Figures 3A, 3A:
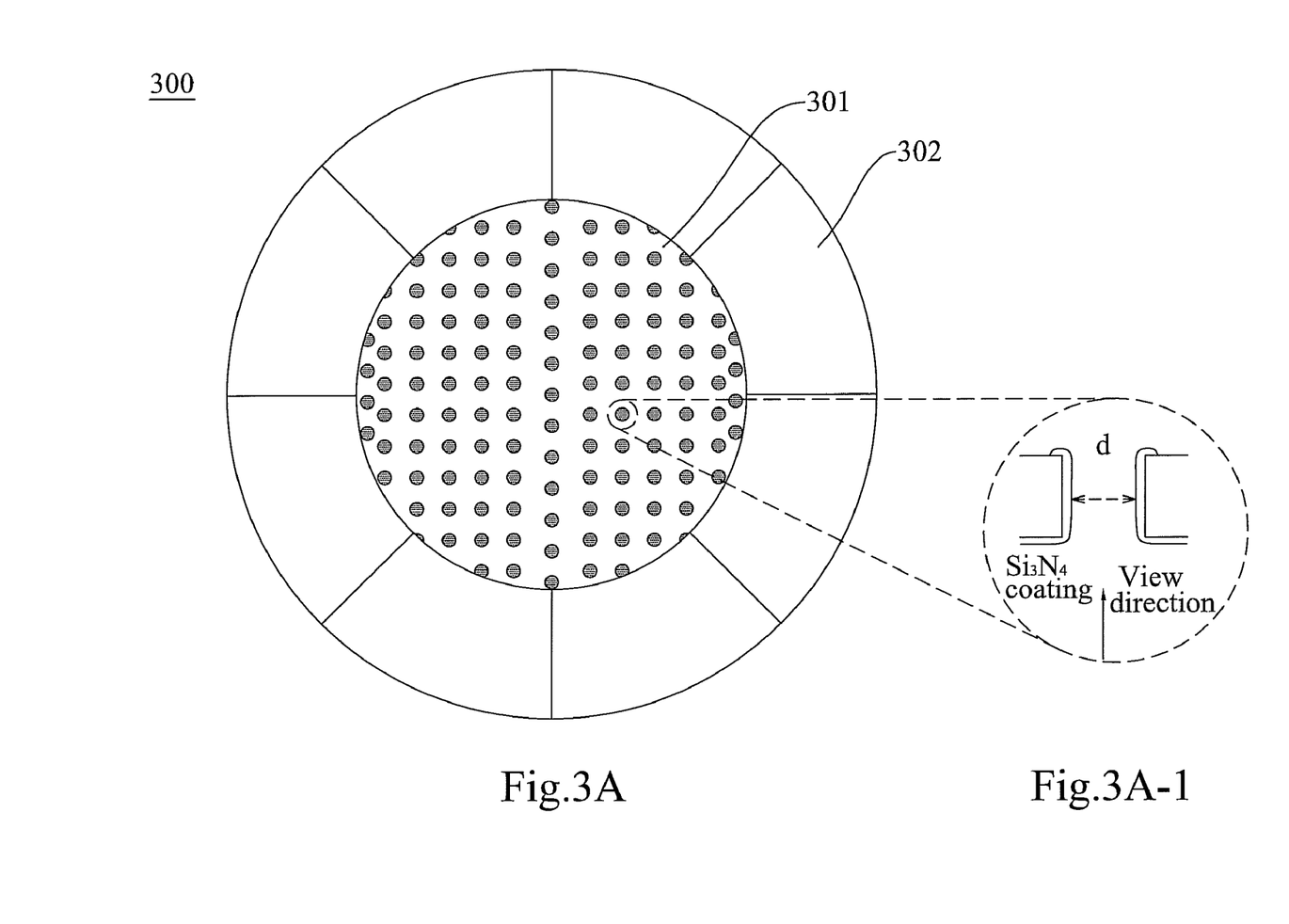
Figures 3B, 3B:
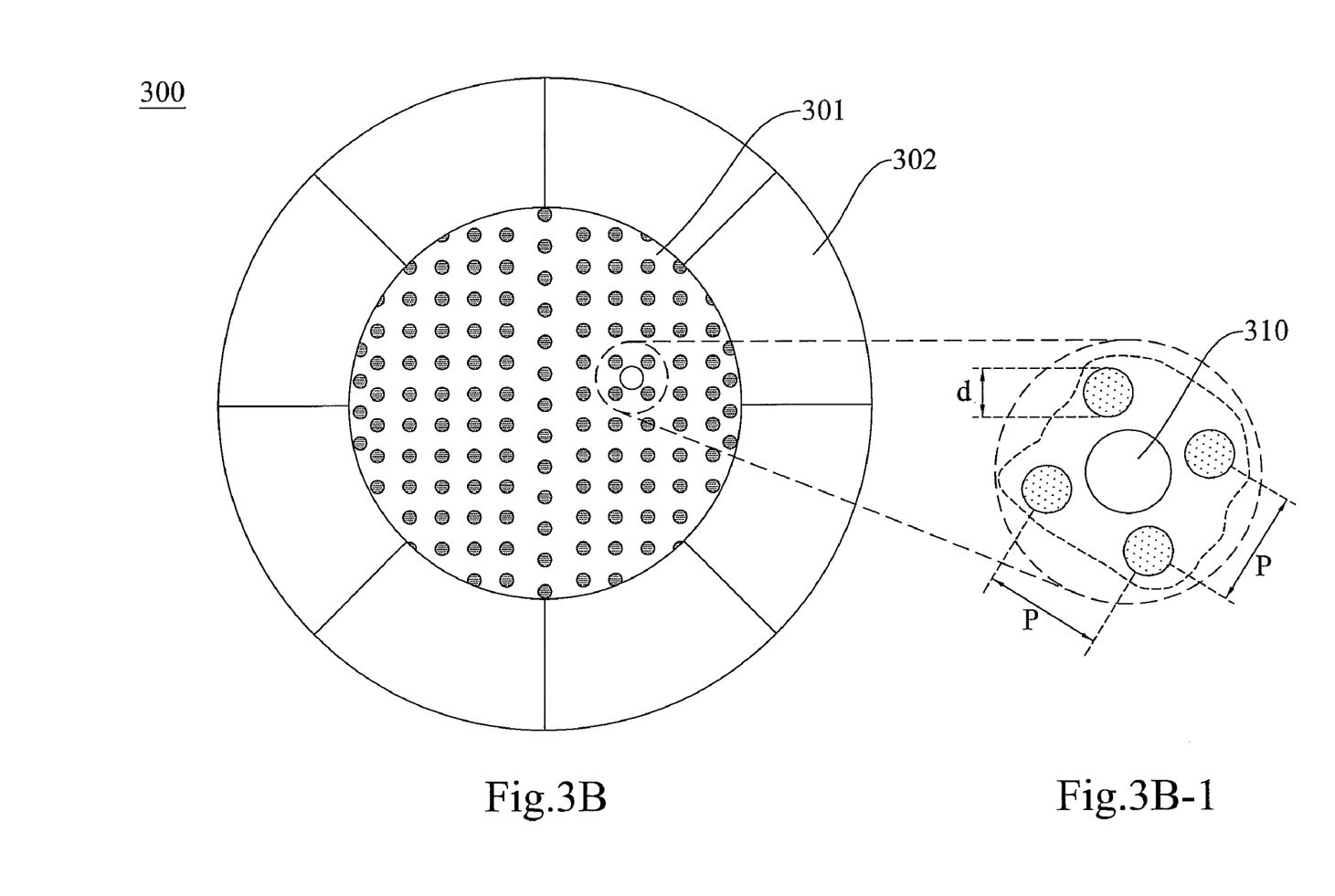

In another embodiment of the present invention, the surface of center plate and at least one extension segment plates are coated with a protective coating layer of plasma erosion preventing material, such as silicon nitride ($Si_3N_4$) or silicon carbide (SiC). Referring now to FIGS. 3A and 3A-1, which illustrates an electrical plate 300 coated with protection coating on the exposed surface, according to an embodiment of the present invention. The thickness of the protection coating may be in a range of 1 to 50 micron. The protection coating may extend through the gas distribution hole as illustrated in FIG. 3A-1, which is a magnified part of the center plate 301, the actual diameter of the gas spurting hole d, after being coated with protection coating, still meets the original specification of the electrical plate. Referring to FIGS. 3B and 3B-1, in the present embodiment, the surface of center plate 301 and/or extension segment plates 302 further comprises at least one coating free region 310 for facilitating electrical connection of the center plate 301 and extension segment plates 302 to the plasma process reaction chamber. The coating free region 310 may be predetermined areas on the surface of the center plate 301 and/or extension segment plates 302, or be the area between the gas spurting holes through out the center plate 301 and/or extension segment plates 302. In an example, as FIGS. 3B and 3B-1 illustrate, each coating free region is positioned within 4 gas distribution holes and may extend through out the whole electrical plate. These coating free regions 310 provide the electrical contact during plasma processing. As illustrated in FIGS. 3B and 3B-1, which illustrate the magnified part of the center plate 301, in the present invention, the open end of the gas distribution holes has a diameter d, for example, of 0.6 mm. The coating free regions 310 may have a diameter slightly larger than the gas distribution holes, for example, 1 mm. In addition, the hole to hole pitch may be kept the same as the gas distribution holes, for example, of 7 mm.

Figure 4:
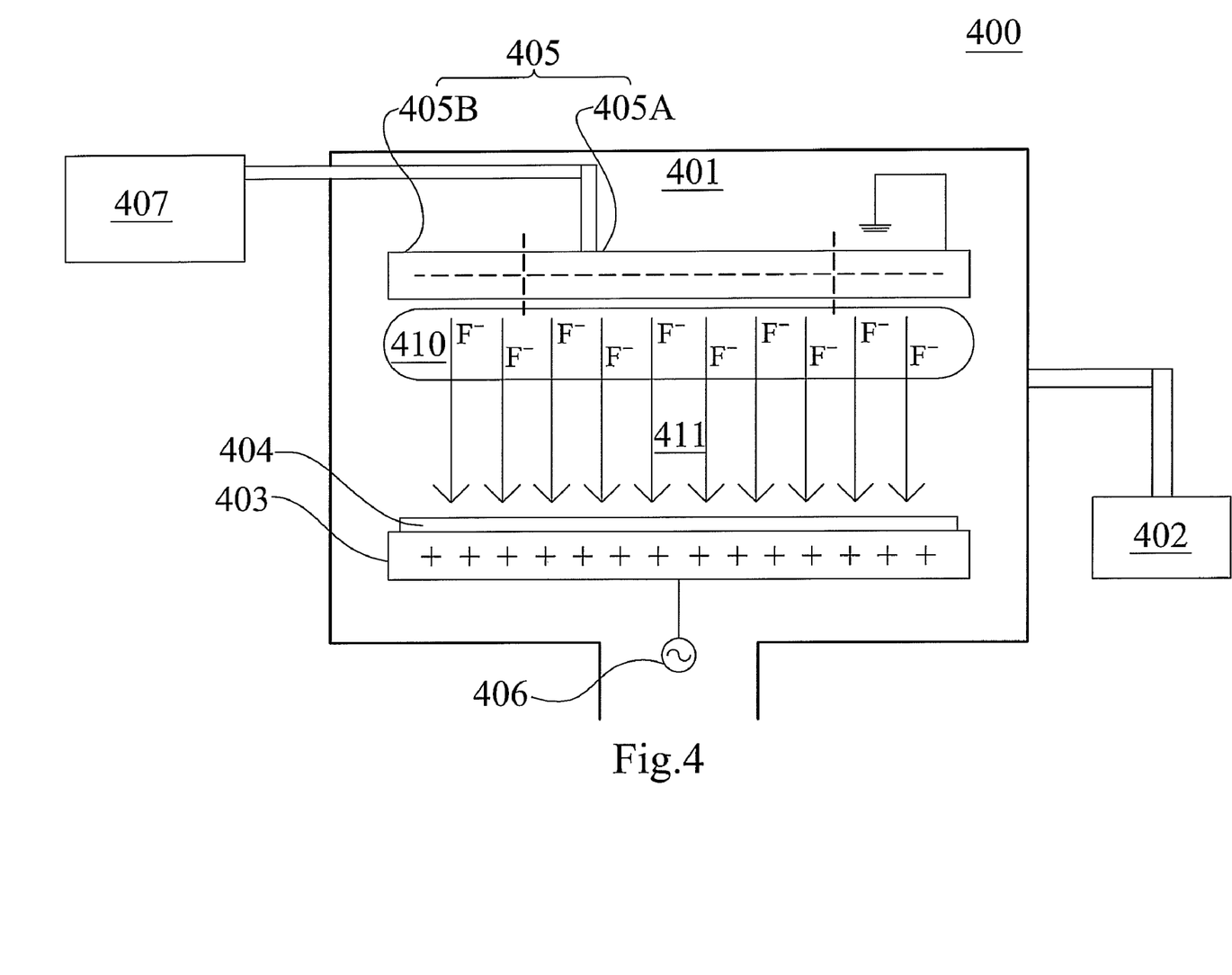
FIG. 4 is a diagrammatic representation of a plasma etch system according to one embodiment of the present invention.

Reference will now be made in detail to use the plasma etch process as an example to express plasma process. FIG. 4 is an illustration of a plasma etch reaction system 400 in accordance with yet another embodiment of the present invention. As shown, the plasma etch reaction system 400 comprises an process reaction chamber 401 being adopted to enclose plasma 410; vacuum device 402 for evacuating the process reaction chamber 401; a chuck electrode 403 for supporting a sample 404; an upper electrode 405 for forming plasma between the chuck electrode 403 and upper electrode 405; a power source 406 for applying electrical power to produce plasma between the chuck electrode 403 and upper electrode 405; and gas supply device 407 for supplying processing gas through upper electrode 405 to reaction chamber 401. The processing gas is a fluorine based chemical as an example. The chuck electrode 403 is disposed within the process reaction chamber 401 spatially corresponding to upper electrode 405. The upper electrode 405, accordance to an embodiment of the present invention, comprises an electrical plate including a center plate 405A and a plurality of extension segment plates 405B. As illustrated, the dimension of the upper electrode and the area of gas spurting region of the processing gas, which is supposed to substantially cover the sample 404, can be increased by adding the extension segment plates 405B to the center plate 405A, and vice versa.

The center plate 405A may be surrounded by and attached to the extension segment plates 405B. The extension segment plates 405B may be attach to each other and to the center plate 405A as well. The center segment plates (not shown) and the extension segment plates 405B may have an arbitrary shape including a polygonal or curved edge as described above.

The extension segment plates 405B may be bonded to each other and to the center plate 405A by brazing, soldering, adhering or mechanical fitting method, or combination thereof In one embodiment, the adhesives or other bonding materials, or materials used to build the mechanical structure could be thermally and electrically conductive materials, such as metals, conductive epoxies, or the like. The bonding material may be preferably formed from low vapor pressure materials which have lower tendencies to contaminate low pressure reactor environments.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. An electrode for plasma processing chamber comprising:
   an electrical plate patched by a plurality of silicon slabs, comprising a center plate and a plurality of extension segment plates, the center plate comprising at least one center segment plate, and having a plurality of first gas distribution holes communicating with a gas inlet and guiding processing gas into a plasma processing reaction chamber for dry etching, and the extension segment plates having at least one second gas distribution hole to communicate with gas inlet and to guide processing gas into the plasma processing reaction chamber;
   wherein the center plate is surrounded by and attached to the extension segment plates, and the extension segment plates are attached to each other; and an area of gas spurting region of processing gas and the dimension of the electrode increases with addition of the extension segment plates and decreases with the removal of extension segment plates.

2. The electrode according to claim 1, wherein the first gas distribution holes have an open end facing a chuck electrode disposed spatially corresponding to the electrode within the plasma processing reaction chamber.

3. The electrode according to claim 1, wherein the second gas distribution holes have an open end facing a chuck electrode disposed spatially corresponding to the upper electrode within the plasma processing reaction chamber.

4. The electrode according to claim 1, wherein the center plate is surrounded by and attached to the extension segment plates.

5. The electrode according to claim 1, wherein the extension segment plates are attached to each other and to the center plate.

6. The electrode according to claim 1, wherein the first and second gas distribution holes are different in diameter, opening shape or interior configuration.

7. The electrode according to claim 1, wherein the center segment plate is identical to the extension segment plate.

8. The electrode according to claim 1, wherein the center segment plates and the extension segment plates each has an arbitrary shape including a polygon or curved edges.

9. The electrode according to claim 1, wherein the center plate has a circular or polygon shape.

10. The electrode according to claim 1, wherein the extension segment plates are bonded to each other and to the center plate by a method selected from a group consisting of brazing, soldering, adhering or mechanical fitting using thermally and electrically conductive materials, or any combination thereof.

11. The electrode according to claim 1, wherein surfaces of the center plate and the at least one extension segment plates are coated with a protective coating layer of plasma erosion preventing material.

12. The electrode according to claim 11, wherein the plasma erosion preventing material is selected from a group consisting of silicon nitride, silicon carbide, or any combination thereof.

13. The electrode according to claim 11, wherein a surface of the center plate and the at least one extension segment plates comprise at least one coating free region.

14. The electrode according to claim 1, wherein the electrical plate and segments are stacked on top of each other to form the electrode.

15. A plasma processing system, comprising:
   a processing chamber for dry etching process reaction;
   a vacuum device for evacuating the processing chamber;
   a chuck electrode for supporting a sample;
   an upper electrode for forming a plasma discharge circuit between the chuck electrode and the upper electrode, the chuck electrode being disposed within the plasma processing chamber spatially corresponding to the upper electrode;
   a power source for applying electrical power to produce plasma between the chuck electrode and the upper electrode; and
   a gas supply device in communication with the upper electrode for supplying a processing gas through upper electrode to processing chamber,
   wherein the upper electrode comprises:
   an electrical plate patched by a plurality of silicon slabs, comprising a center plate and a plurality of extension segment plates, the center plate comprising at least one center segment plate which contains a plurality of first gas distribution holes, the extension segments contains a plurality of second gas distribution holes;

wherein the center plate is surrounded by and attached to the extension segment plates, and the extension segment plates are attached to each other; and an area of gas spurting region of the processing gas and the dimension of the upper electrode increases with addition of the extension segment plates and decreases with removal of the extension segment plates.

16. The plasma processing system according to claim 15, wherein the center plate is surrounded by and attached to the extension segment plates.

17. The plasma processing system according to claim 15, wherein the extension segment plates are attached to both each other and the center plate.

18. The plasma processing system according to claim 15, wherein at least one second gas distribution hole is formed on the extension segment plates; wherein the second gas distribution hole communicates with the gas inlet and guiding the processing gas into the plasma process reaction chamber and the second gas distribution holes comprises an open end facing the chuck electrode.

19. The plasma processing system according to claim 15, wherein the first and second gas distribution holes are different in diameter, opening shape or interior configuration.

20. The plasma processing system according to claim 15, wherein the center segment plate is identical to the extension segment plate.

21. The plasma processing system according to claim 15, wherein the center segment plates and the extension segment plates comprise an arbitrary shape including a polygon or a curved edge.

22. The plasma processing system according to claim 15, wherein the center plate comprises a circular or polygon shape.

23. The plasma processing system according to claim 15, wherein the extension segment plates are bonded to each other and to the center plate using thermally and electrically conductive materials by a brazing, soldering, adhering or mechanical fitting method, or any combination thereof.

24. The plasma processing system according to claim 15, wherein a surface of the center plate and extension segment plates are coated with a protective coating layer of plasma erosion preventing material.

25. The plasma processing system according to claim 24, wherein the plasma erosion preventing material is selected from a group consisting of silicon nitride, silicon carbide, and any combination thereof.

26. The plasma processing system according to claim 25, wherein a surface of the center plate and extension segment plates comprises at least one coating free region for electrical contact during reaction in the processing chamber.

27. The electrode according to claim 15, wherein the electrical plate and segments are stacked on top of each other to form the electrode.

* * * * *